SEMICONDUCTOR DEVICES AND TRIGGER CIRCUITS THEREFOR

Filed Jan. 19, 1954 3 Sheets-Sheet 1

INVENTOR.
HAROLD L. ARMSTRONG

BY

ATTORNEY

March 1, 1960 H. L. ARMSTRONG 2,927,221

SEMICONDUCTOR DEVICES AND TRIGGER CIRCUITS THEREFOR

Filed Jan. 19, 1954 3 Sheets-Sheet 2

INVENTOR.
HAROLD L. ARMSTRONG
BY Francis N. Marsella
ATTORNEY

March 1, 1960 H. L. ARMSTRONG 2,927,221

SEMICONDUCTOR DEVICES AND TRIGGER CIRCUITS THEREFOR

Filed Jan. 19, 1954 3 Sheets-Sheet 3

INVENTOR.

HAROLD L. ARMSTRONG

BY

ATTORNEY 2,927,221

SEMICONDUCTOR DEVICES AND TRIGGER CIRCUITS THEREFOR

Harold L. Armstrong, Euclid, Ohio, assignor to Clevite Corporation, Cleveland, Ohio, a corporation of Ohio Application January 19, 1954, Serial No. 404,851
16 Claims. (Cl. 307—88.5)

This invention relates to a semiconductor device for use in various electrical circuits.

In its broad general aspect the present invention is concerned with the provision in various electrical devices of a novel semiconductor configuration in which a pair of base electrodes have ohmic contacts to opposite ends of a semiconductor for establishing an electric field therein, and a plurality of other electrodes have rectifying junction contacts to the semiconductor at locations thereon which are normally at the same potential, intermediate the respective potentials at the base electrodes. In the absence of a change in the potential gradient between the ends of the semiconductor, no current flows between any of the junction and base electrodes through the semiconductor. However, when the potential gradient in the semiconductor between a predetermined one of the junction electrodes and one of the base electrodes is altered, current is caused to flow between that junction electrode and the corresponding base electrode through the semiconductor, current at the other junction electrode or electrodes being cut off at this time. This condition remains stable until the potential relations between the conducting junction electrode and the semiconductor change so that current at this electrode is cut off and current flows at one of the previously non-conducting junction electrodes, and so on, in a controlled sequence.

The foregoing generic principles of the present invention may be employed advantageously in a variety of semiconductor configurations which may be used in various practical circuits including, but not limited to, bistable circuits, square wave generators, and wave squarers.

Accordingly, it is an object of the present invention to provide a novel semiconductor device adapted for use in a variety of electrical devices.

It is a specific object of the present invention to provide a novel bistable circuit employing a semiconductor device.

It is also a specific object of this invention to provide a novel square wave generator which employs a semiconductor device.

Another specific object of this invention is to provide a novel wave squarer employing a semiconductor device.

A further specific object of this invention is to provide a circuit employing a semiconductor device which is stable in any one of a number of current conducting conditions in the semiconductor.

These and other objects and advantages of the present invention will be apparent from the following description of several preferred embodiments thereof, which are shown in the accompanying drawings to illustrate the principles of the present invention without intending, however, that this invention be considered as being limited to these specific embodiments.

Figure 1:
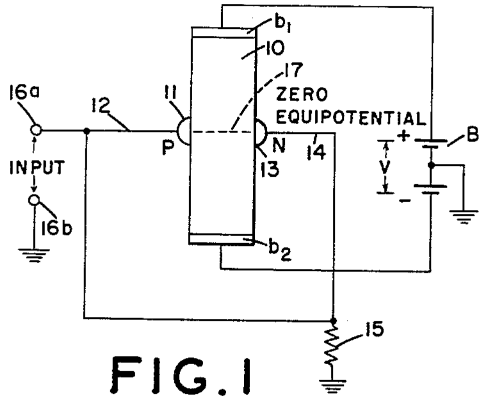
Figure 1 is a schematic diagram of a circuit employing one embodiment of the semiconductor configuration of the present invention, and illustrating the conditions when both of the junction electrodes are non-conducting.
Figure 2:
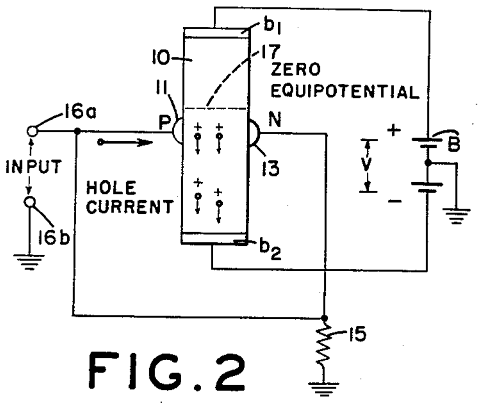
Figure 2 is a view similar to Figure 1 and showing the current and voltage conditions in the Fig. 1 semiconductor device when the P junction electrode is conducting and the N junction electrode is cut off.
Figure 3:
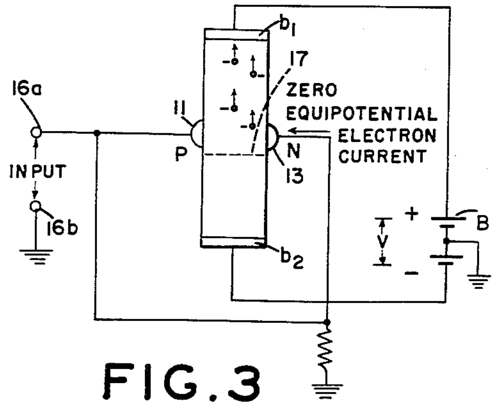
Figure 3 is a view similar to Figure 1 and showing the current and voltage conditions in the Fig. 1 semiconductor device when the N junction electrode is conducting and the P junction electrode is cut off.

Referring first to the embodiment of the present invention shown in Figs. 1–3, there is provided a rectangular oblong semiconductor bar 10, which is of substantially intrinsic semiconductor material, such as pure germanium, having no substantial polarity, either positive or negative. At opposite ends of the semiconductor 10 there are provided base electrodes $b_1$ and $b_2$, preferably of lead or tin, which have low resistance, large area, ohmic contacts, respectively, with the semiconductor thereat. Midway between the ends of the semiconductor a dot 11, preferably of indium, but which also might be of gallium or aluminum, is fused into one face of the semiconductor to provide a rectifying junction thereat for a conductor 12. On the opposite face of the semiconductor a dot 13 is fused into the semiconductor midway between the ends of the semiconductor and provides a rectifying junction for the conductor 14. Dot 13 preferably is of lead-antimony or tin-antimony alloy, but might also be of other suitable material. As is well understood, due to the dissimilarities of the metals, at the indium dot 11 current tends to flow between conductor 12 and the semiconductor 10 only when this dot is positive with respect to the contiguous semiconductor material. Therefore, at the indium dot 11 there is what is referred to as a P-type rectifying junction. Conversely, at the other dot 13 current tends to flow between conductor 14 and the semiconductor only when this dot is negative with respect to the semiconductor at the junction. Therefore, at the dot 13 there is an N-type rectifying junction.

The conductors 12 and 14 are connected through resistor 15 to ground and hence are normally at ground potential, in the absence of a signal across the input terminals 16_a_ and 16_b_. Base electrode $b_1$ is connected to a suitable D.C. voltage source to have a potential $$+\frac{V}{2}$$

while the other base electrode $b_2$ has a potential $$-\frac{V}{2}$$

In the illustrated embodiment this is accomplished by providing a battery B of voltage V having its positive terminal connected to electrode $b_1$, its negative terminal connected to electrode $b_2$, and having a center tap connected to ground. Therefore, midway between the base electrodes $b_1$ and $b_2$ the semiconductor normally has a zero potential along the equipotential line 17, where the conductors 12 and 14 have rectifying junctions 11 and 13, respectively, with the semiconductor.

With this arrangement, initially in the absence of an input signal (Fig. 1) there is no current between the parallel-connected, grounded, rectifying junctions 11 and 13 and the semiconductor.

However, when current flows through conductor 12 and the P junction at indium dot 11 into the semiconductor the hole current injected into the semiconductor will be swept by the electric field in the semiconductor established by the oppositely biased base electrodes down to the negative base electrode $b_2$. Because of this hole current, the resisitivity of the lower half of the semiconductor will be reduced, with the result that the zero equipotential line 17 in the semiconductor will assume a position between the positive base electrode $b_1$ and the P and N junctions, as shown in Fig. 2. Therefore, both junctions 11 and 13 will be positive with respect to the contiguous portions of the semiconductor. Accordingly, no current will flow through the N junction 13, while current will continue to flow through the P junction 11, and this condition is stable.

Conversely, if the N junction 13 began emitting electrons into the semiconductor, these electrons would be swept toward the positive base electrode $b_1$. Therefore, the upper end of the semiconductor would have its resistivity lowered, with the result that the zero equipotential line 17 in the semiconductor would be located below both junctions (Fig. 3). Both junctions 11 and 13 would therefore be negative with respect to the contiguous semiconductor material, and the N junction 13 would continue to conduct, while the P junction 11 would be cut off. This condition also is stable. Thus, the device of Figs. 1–3 has two stable states, one in which the P junction conducts and the N junction is cut off, and the other in which the N junction conducts and the P junction is cut off.

A bistable circuit employing the semiconductor device described above is shown in Fig. 4. In this circuit the semiconductor 10 has its positive base electrode $b_1$ connected through a switch 26 to the positive terminal 20 of a D.C. voltage source such as battery B of voltage V. The other base electrode $b_2$ is grounded. The P and N junctions 11 and 13 at the midpoints on opposite faces of the semiconductor 10 are connected, in parallel with one another, through a parallel R–C circuit 21, 22 to the midpoint 23 of a voltage divider 24, 25 connected between positive terminal 20 and ground. Therefore, point 23 is normally (switch 26 being closed) at a potential $V/2$.

With the foregoing conditions, assume initially that the P junction is conducting. Due to the resulting current in, and voltage drop across, resistor 21 each of the junctions P and N would be negative with respect to point 23. Thus, the $V/2$ equipotential line in the semiconductor 10 would be closer to the positive base electrode $b_1$ than the P and N junctions, similar to the condition shown in Fig. 2. While the P junction would continue to emit holes into the semiconductor, which are swept to the grounded base $b_2$, the N junction would be cut off.

Now, let the voltage V applied to the circuit be reduced momentarily to zero, as by opening switch 26. When this occurs, point 23 immediately drops to zero potential. However, since the charge on capacitor 22 cannot leak off immediately, both of the junctions 11 and 13 go negative with respect to ground. At this time, the potential throughout the semiconductor will have dropped to ground potential. Therefore, the N junction will begin to emit electrons into the semiconductor and the P junction does not draw current. When the applied voltage V is next restored to its original value, as by closing swtich 26, the N junction continues to draw current, the $V/2$ equipotential line in the semiconductor assumes a position between the P and N junctions and the grounded base electrode $b_2$ due to the lowered resistivity of the upper end of the semiconductor resulting from the electron current from the N junction, and the P junction remains cut off. This condition prevails until the applied voltage V is next again reduced to zero.

In connection with the foregoing explanation it should be noted that when switch 26 is re-closed the point 23 becomes positive; in fact, it assumes a potential $V/2$. The semiconductor material adjacent to the N junction (to both junctions, for that matter) also becomes positive, and, if neither junction injected extra carriers, it would also assume a potential $V/2$. However, due to the residual charge on the capacitor 22, both junctions will be a little negative with respect to point 23, i.e., they will be at a potential a little less than $V/2$. Thus, both junctions will be somewhat negative with respect to the adjacent semiconductor material. Under these circumstances it will be the N junction which will tend to conduct, and it will conduct mainly by injecting electrons into the semiconductor. These electrons will flow upward (as viewed in Figure 4) and will cause the resistance of the upper half of the semiconductor bar to be less than that of the lower half. Accordingly, the potential of the semiconductor adjacent to the junctions will become greater than $V/2$ (something between $V/2$ and V). Thus the semiconductor adjacent to the junctions will remain positive with respect to the junctions even after the discharge of the capacitor 22 has ceased, and the N junction will go on conducting.

Figure 4:
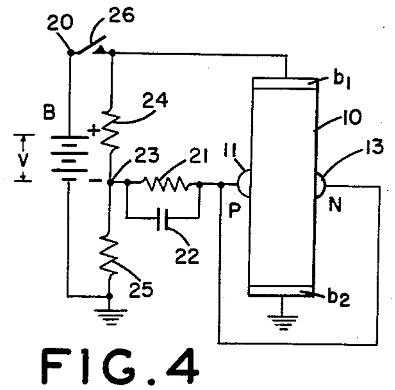
Figure 4 is a schematic circuit diagram of a bistable circuit employing the Figure 1 semiconductor configuration.

Thus, the Fig. 4 arrangement has two stable states, and switching from one to the other may be accomplished simply by momentarily lowering the applied voltage to zero, as described.

Figure 5:
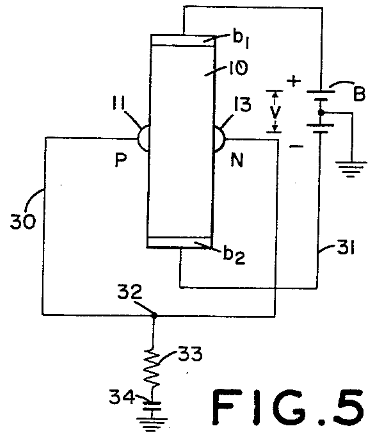
Figure 5 is a schematic diagram of an oscillation generator which employs the Figure 1 semiconductor device.

A second practical embodiment of the semiconductor configuration of Figs. 1–3 is shown in Fig. 5 in the form of a square wave oscillation generator. In this device, the germanium semiconductor 10 has its positive base electrode $b_1$ connected to a voltage source $$+\frac{V}{2}$$

The negative base electrode $b_2$ at the opposite end of the semiconductor is at a voltage $$-\frac{V}{2}$$

In the illustrated embodiment this is accomplished by providing a battery B of voltage V having its positive terminal connected to electrode $b_1$, its negative terminal connected to electrode $b_2$, and having a center tap connected to ground. The P and N rectifying junctions 11 and 13 are fused to the midpoints of the semiconductor on opposite faces thereof. The zero equipotential line in the semiconductor normally extends through these junctions. The P and N junctions are connected through lines 30 and 31 in parallel with each other to one terminal 32 of a resistor 33. The other end of the resistor is connected to one terminal of a capacitor 34, which has its other terminal grounded.

Figure 6:
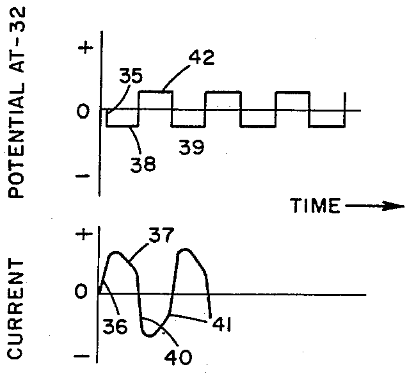
Figure 6 is a diagram showing the current and voltage relations in the Figure 5 circuit.

Theoretically, if the semiconductor device of Fig. 5 were perfectly balanced and symmetrical, no current would ever flow in the circuit. However, due to the practical impossibility of making this semiconductor device perfectly balanced, one or the other of the P and N junctions will start to draw current. Assuming for purposes of this discussion that the P junction first starts to draw current, it will inject hole current into the semiconductor, lowering the resistivity of the lower end of the semiconductor and causing the zero equipotential line in the semiconductor to assume a position between the P and N junctions and the positive base electrode $b_1$. Initially, therefore, the semiconductor contiguous to the P and N junctions will have a potential negative with respect to ground (and therefore negative with respect to point 32). As the P junction draws current, the resulting current through resistor 33 causes the voltage at 32 to drop substantially immediately to a value negative with respect to ground, but slightly positive with respect to the semiconductor contiguous to the P junction. This instantaneous voltage drop is indicated at 35 on the voltage wave form in Fig. 6 and is caused by the current surge represented at 36 in the current wave form shown in this figure.

Initially, the upper terminal (adjacent resistor 33) of the capacitor 34 was at ground potential, so that the initial voltage drop due to the current surge 36 was across resistor 33 only. As the current continues to flow, it causes this terminal of the capacitor to become increasingly negative, so that an increasing proportion of the voltage drop from ground to point 32 occurs across capacitor 34 and the voltage drop across resistor 33 decreases. Therefore, the current to the P junction decreases gradually, as indicated at 37 in the current wave form in Fig. 6. At this time, the potential at point 32 (and at the P and N junctions) remains at a substantially constant value negative with respect to ground, indicated at 38 on the voltage wave form in Fig. 6.

As the current drawn by the P junction decreases, the hole current injected into the semiconductor by the P junction decreases accordingly. Therefore, the resistivity of the lower end of the semiconductor increases gradually and ultimately the semiconductor contiguous to the P and N junctions assumes a potential positive with respect to these junctions (even though still negative with respect to ground). When this happens, the P junction ceases to draw current, and the N junction begins to draw current and emits electrons into the semiconductor. These electrons are swept toward the positive base electrode $b_1$ lowering the resistivity of the upper end of the semiconductor and causing the zero equipotential line in the semiconductor to assume a position between the junctions and the negative base electrode $b_2$. Therefore, the semiconductor contiguous to the P and N junctions assumes a potential positive with respect to ground, as well as positive with respect to these junctions. As the N junction continues to draw electron current, the resulting voltage difference across resistor 33 causes the potential at point 32 to rise to a value positive with respect to ground and slightly negative with respect to the semiconductor contiguous to the P and N junctions. This instantaneous voltage change is indicated at 39 on the voltage wave form in Fig. 6, having been caused by the electron current surge indicated at 40 on the current wave form in this figure.

The voltage rise due to the electron current surge 40 occurs substantially entirely across resistor 33, at which time, due to this current surge, the potential on the upper terminal of capacitor 34 goes from negative to positive with respect to ground. As the electron current continues to flow it causes the upper terminal of capacitor 34 to become increasingly positive, so that an increasing proportion of the voltage drop from point 32 to ground takes place across capacitor 34 and the voltage rise across resistor 33 decreases in magnitude. Accordingly, the electron current at the N junction decreases gradually, as indicated at 41 in Fig. 6. At this time the potential at point 32 and at the P and N junctions remains substantially constant, as indicated at 42 in Fig. 6, positive with respect to ground, but slightly negative with respect to the semiconductor contiguous to the P and N junctions.

As the electron current drawn by the N junction decreases, the electron current injected into the semiconductor by the N junction decreases accordingly. Therefore, the resistivity of the upper end of the semiconductor increases gradually and ultimately the semiconductor contiguous to the P and N junctions assumes a potential negative with respect to these junctions, although still positive with respect to ground. When this happens, the N junction ceases to draw current and the P junction starts to conduct, emitting hole current into the semiconductor. These holes are swept toward the negative base electrode $b_2$, lowering the resistivity of the lower end of the semiconductor and causing the zero equipotential line in the semiconductor to assume a position between the P and N junctions and the positive base electrode $b_1$. Therefore the semiconductor contiguous to the junctions assumes a potential negative with respect to ground as well as negative with respect to these junctions. As the P junction continuous to conduct, the resulting current through resistor 33 causes the potential at point 32 to go negative with respect to ground, and the foregoing cycle repeats itself.

Thus, the circuit of Fig. 5 sustains the current oscillations indefinitely after they have once started, as long as the applied voltages are maintained at the base electrodes.

Figure 7:
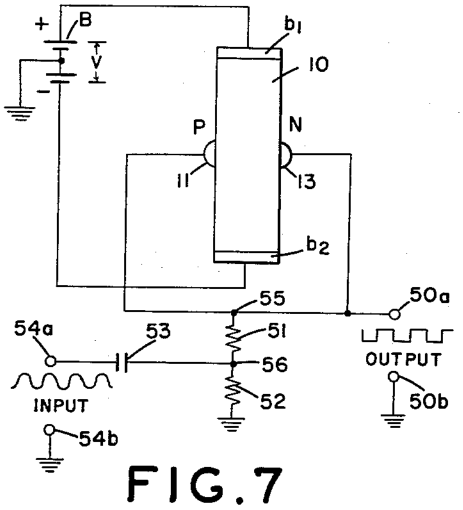
Figure 7 is a schematic diagram of a wave squarer employing the Figure 1 semiconductor device and operating from a sinusoidal input.

Another aspect of the present invention is illustrated in Fig. 7, which shows a circuit incorporating the Fig. 1 semiconductor device and intended for the purpose of converting a sine wave input into a square wave output. In this circuit, the semiconductor 10 has its positive base electrode $b_1$ connected to a positive D.C. voltage source to have a potential $$+\frac{V}{2}$$

while the negative base electrode $b_2$ at its opposite end is at a potential $$-\frac{V}{2}$$

In the illustrated embodiment this is accomplished by providing a battery B of voltage V having its positive terminal connected to electrode $b_1$, its negative terminal connected to electrode $b_2$, and having a center tap connected to ground. The P and N junctions 11 and 13 are fused to opposite faces of the semiconductor midway between the base electrodes $b_1$ and $b_2$. In the absence of any current, the zero equipotential line in the semiconductor would extend through the junctions. The P and N junctions are connected in parallel to an output terminal 50a and to an input circuit including a pair of resistors 51 and 52 connected in series between the P and N junctions and ground and a coupling condenser 53 connected between the juncture of these resistors and an input terminal 54a.

Theoretically, if the semiconductor device in Fig. 7 were perfectly balanced, there would be no current to either junction in the absence of an input signal across terminals 54a, 54b. However, since this theoretical condition is not possible to obtain in practice, one or the other of the junctions will begin to draw current. Assuming, for purposes of this discussion, that the N junction first begins to draw current, it will emit electrons into the semiconductor 10 which are swept toward the positive base electrode $b_1$. This electron current through the upper end of the semiconductor lowers the resistivity there so that the zero equipotential in the semiconductor assumes a position between the junctions and the negative base electrode $b_2$. Since the portion of the semiconductor contiguous to the junctions is now positive with respect to the junctions due to the electron current, the N junction will continue to emit electron current into the semiconductor, and this condition will prevail until an input signal is applied across input terminals 54a, 54b.

As a result of the voltage rise across resistors 52, 51 due to this electron current, point 55 in the Fig. 7 circuit will assume a positive potential somewhere between ground and $$+\frac{V}{2}$$

Figure 8:
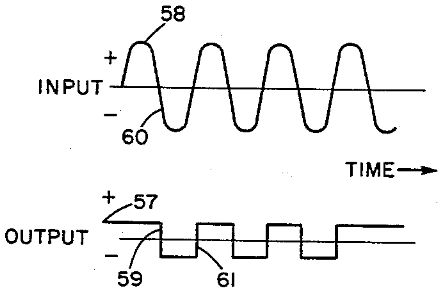
Figure 8 is a diagram showing a comparison of the input and output voltages in the Figure 7 device.

This assumed initial condition is shown on the output voltage curve at 57 in Fig. 8.

When a positive input signal is applied across input terminals 54*a*, 54*b*, as in the form of the positive half cycle of a sine wave input shown at 58 in Fig. 8, the point 56 at the juncture of resistors 51 and 52 will become increasingly positive, approaching the positive potential at point 55 initially caused by the electron current drawn by the N junction. As the voltage across resistor 51 decreases the current therethrough will decrease so that the N junction will inject a decreasing electron current into the semiconductor. Therefore, the resistivity of the upper end of the semiconductor will increase progressively and the potential in the semiconductor contiguous to the N junction will ultimately become negative with respect to the P and N junctions, even though still positive with respect to ground. When this happens, the N junction will cease to draw current and the P junction will begin to conduct. When this happens, the potential at point 55 reverses in sign instantaneously, as indicated at 59 in Fig. 8. By properly selecting the condenser 53, this voltage reversal at point 55 preferably is caused to occur at about the same time that the input signal reverses in sign.

When the P junction injects hole current into the semiconductor this hole current is swept toward the negative base electrode $b_2$, with the result that the resistivity of the lower end of the semiconductor is decreased and the zero equipotential in the semiconductor assumes a position between the P and N junctions and the positive base electrode $b_1$. As indicated above, the current drawn by the P junction causes point 55 to assume a potential negative with respect to ground. However, due to the application of the negative half cycle 60 (Fig. 8) of the input voltage, the point 56 at the opposite end of resistor 51 is driven increasingly negative, resulting in a progressively smaller voltage across resistor 51. This, of course, decreases the current supplied to the P junction, and the hole current in the semiconductor decreases accordingly. For this reason, the resistivity of the lower end of the semiconductor will increase progressively and the potential in the semiconductor contiguous to the P and N junctions will ultimately become positive with respect to these junctions, although still negative with respect to ground. When this happens, the P junction will be cut off and the N junction begins to conduct. The electron current to the N junction causes the potential at point 55 to reverse in sign, as indicated at 61 on the output voltage curve in Fig. 8. Due to the time delay caused by condenser 53, this potential reversal at point 55 occurs when the input signal at terminals 54*a*, 54*b* reverses in sign from negative to positive.

Thereafter, the above cycle repeats itself as long as the input signal is applied.

Figure 9:
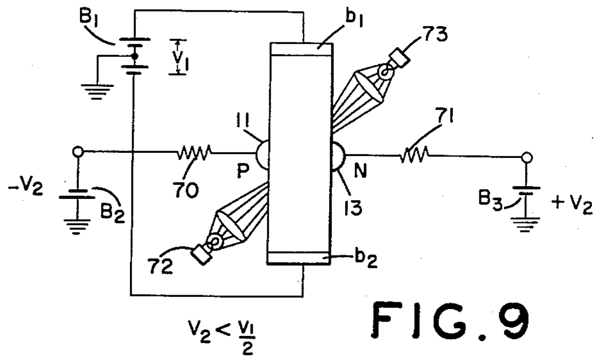
Figure 9 is a schematic view of a semiconductor device similar to that of Figure 1 and operated to have any one of three stable states, depending upon the operation of a pair of light sources.

Still another embodiment of the present invention is shown in Fig. 9 in a circuit which has an operation based upon the principle that the resistivity of germanium may be lowered by exposure to light. In this arrangement, there is provided an intrinsic semiconductor in the form of a purified germanium bar 10 which has base electrodes $b_1$ and $b_2$ contacting its opposite ends and providing ohmic contacts thereat. The positive base electrode $b_1$ is connected to a positive voltage source $$+\frac{V_1}{2}$$

while the negative base electrode $b_2$ is at a negative potential $$-\frac{V_1}{2}$$

In the illustrated embodiment this is accomplished by providing a battery $B_1$ of voltage V having its positive terminal connected to electrode $b_1$, its negative terminal connected to electrode $b_2$, and having a center tap connected to ground. An indium dot 11 provides a rectifying P junction at one face of the semiconductor midway between its ends and a lead-antimony dot 13 provides a rectifying N junction at the opposite face of the semiconductor, also midway along the semiconductor. The P junction is connected through a resistor 70 to a source, battery $B_2$ of negative voltage at a potential $-V_2$, while the N junction is connected through a resistor 71 to a source, battery $B_3$, of positive voltage at a potential $+V_2$. The magnitude of $V_2$ is less than the magnitude of $V_1/2$. A light source 72 is arranged to shine on the semiconductor between the P junction and the negative base electrode $b_2$. Another light source 73 is arranged to shine on the semiconductor between the N junction and the positive base electrode $b_1$.

This device has three stable states, as follows:

In the absence of light at either light source, both the P and N junctions will be cut off because both are inversely biased with respect to the contiguous portion of the semiconductor, which would be at zero potential due to the electric field established in the semiconductor by the base electrodes.

If light is applied by source 72 to the semiconductor between the P junction and the negative base electrode $b_2$, the resistivity of the lower end of the semiconductor will decrease, causing the semiconductor contiguous to the P and N junctions to assume a potential negative with respect to both these junctions. Accordingly, the P junction will emit hole current into the semi-conductor which is swept toward the negative base electrode $b_2$. The N junction remains cut off. This condition would prevail even if the light source 72 were shut off because the hole current through the semiconductor would maintain the resistivity lowered in the lower end of the semiconductor, thereby maintaining the germanium contiguous to the P and N junctions at a potential negative with respect to both junctions.

Conversely, if, starting with a condition in which neither junction was drawing current, light is applied by source 73 to the semiconductor between the N junction and the positive base electrode $b_1$, then the resistivity of the upper end of the semiconductor would be reduced. Therefore, the zero equipotential in the semiconductor would assume a position between the P and N junctions and the negative base electrode $b_2$, and the semiconductor contiguous to the P and N junctions would assume a potential positive with respect to these junctions. The N junction would emit electrons into the semiconductor which are swept to the positive base electrode $b_1$, while the P junction would remain non-conducting. This condition would prevail even if the light source 73 were shut off because the electron current through the upper end of the semiconductor would maintain the resistivity lowered there, so that the semiconductor contiguous to the P and N junctions would have a potential negative with respect to both.

Assuming that the light sources 72 and 73 have equal effects on the semiconductor, and further assuming that the P and N junctions are equally biased (though opposite in sign), if the P junction is conducting and the light source 72 remains on, it is not possible to cut off the P junction and render the N junction conducting merely by causing light from the other source 73 to impinge on the semiconductor. While the light sources would counterbalance each other in affecting the resistivity of opposite ends of the semiconductor, the hole current already injected into the semiconductor by the P junction would maintain the semiconductor contiguous to the P and N junctions at a potential negative with respect to both, assuming that the negative voltage source $-V_2$ and the resistor 70 have been properly chosen to establish a bias on the P junction suitable for this purpose.

The converse holds true if the N junction was conducting first.

Therefore, with such an arrangement, in order to switch the current from one junction to the other, it would be necessary to first shut off the first light source. Then, by a proper choice of the circuit elements, the other light source could overcome the effect on the potential gradient in the semiconductor of the current injected by the originally conducting junction, so that the other junction would then draw current.

Alternatively, either by making one light source more effective on the semiconductor than the other, or by having biases of different magnitudes on the P and N junctions, it would be possible to switch the current from one junction to the other by turning on the other light source even while the first light source remained on.

Figure 10:
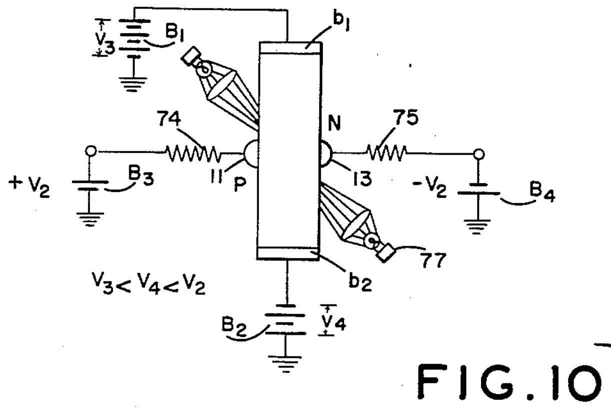
Figure 10 is a schematic view of an alternative light responsive semiconductor in accordance with the present invention.

A further modification of the foregoing arrangement is shown in Fig. 10. In this device, the base electrode $b_1$ having an ohmic contact at one end of semiconductor 10 is connected to a source, battery $B_1$, of positive voltage $+V_3$. The base electrode $b_2$ which has an ohmic contact with the opposite end of the semiconductor is connected to a source, battery $B_2$, of negative voltage $-V_4$. $V_3$ is greater in magnitude than $V_4$. Therefore the zero equipotential in the semiconductor normally assumes a position in the lower end of the semiconductor, closer to the negative base electrode $b_2$ than to the positive base electrode $b_1$. The P and N junctions 11 and 13 are connected to opposite faces of the semiconductor midway between its ends and are connected respectively through resistors 74 and 75 to sources, batteries $B_3$ and $B_4$, of potential $+V_2$ and $-V_2$, respectively, which are equal in magnitude and opposite in sign. A first light source 76 is arranged to shine on the semiconductor between the P junction and the positive base electrode $b_1$. A second light source 77 is arranged to have its light impinge on the semiconductor between the N junction and the negative base electrode $b_2$.

In the operation of this device, in the absence of light from either source, the base electrodes $b_1$ and $b_2$ establish a potential gradient through the semiconductor such that the semiconductor contiguous to the P and N junctions has a potential positive with respect to both junctions (and positive with respect to ground). Under these conditions, the P junction would be cut off and the N junction would draw current. Electrons emitted into the semiconductor by the N junction are swept to the positive base electrode $b_1$, with the result that the zero equipotential in the semiconductor will shift even further in the direction of the negative base electrode $b_2$. This condition is stable.

To switch from the N junction to the P junction, light from the source 76 is caused to impinge on the semiconductor between the P junction and the positive base electrode $b_1$. This lowers the resistivity of the upper end of the semiconductor to the extent that the semiconductor contiguous to the P and N junctions assumes a potential negative with respect to both. Thus, the light source overcomes the effect of the unequal positive and negative biases on the base electrodes and the distortion of the potential gradient in the semiconductor caused by the current injected into it by the N junction. When this occurs, the N junction will cut off and the P junction will conduct, injecting holes into the semiconductor which are swept to the negative base electrode $b_2$. This condition is stable as long as the light source 76 only is on.

If the light source 76 is cut off, then the base electrodes would shift the potential gradient in the semiconductor, overcoming the effect on this potential gradient caused by the hole current from the P junction, until the semiconductor contiguous to the P and N junctions becomes positive with respect to both. When this happens, the P junction ceases to conduct and the N junction begins to draw current.

The same result may be achieved, while light source 76 remains on, by causing the other light source 77 to shine on the semiconductor between the N junction and the negative base electrode. When this happens, the combined effect of the base electrode potentials and the light source 77 overcomes the combined effect of the light source 76 and the hole current in the semiconductor from the P junction. The semiconductor contiguous to the P and N junctions, therefore, assumes a potential positive with respect to both junctions, cutting off the P junction and starting the N junction to conduct.

Figure 11:
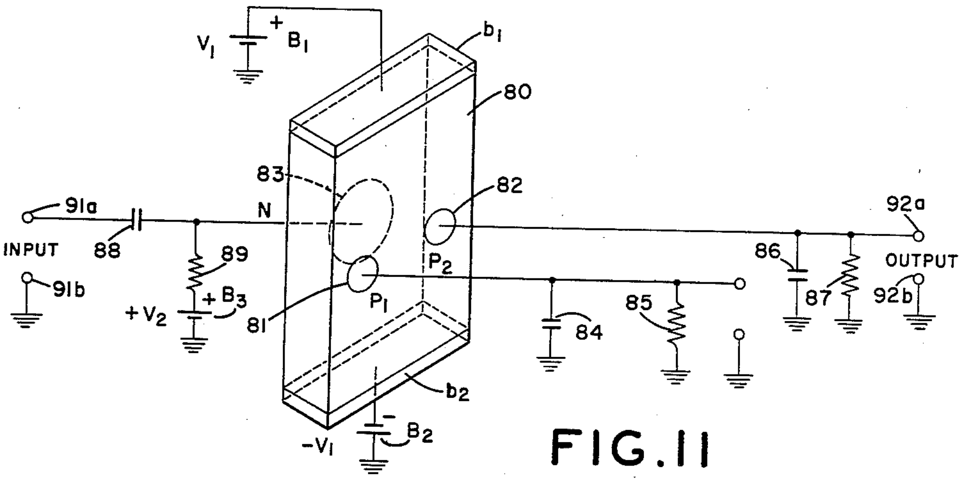
Figure 11 is a perspective view of an alternative embodiment of the semiconductor of the present invention, together with a schematic diagram of a circuit providing bistable operation.

In Figure 11, there is shown a still further embodiment of the invention, which may be used for bistable circuit operation. In Fig. 11, there is provided an intrinsic semiconductor in the form of a thin, relatively wide, rectangular bar 80 of purified germanium. A base electrode $b_1$ has ohmic contact with one end of the semiconductor and is maintained at a positive potential $+V_1$ as by battery $B_1$. At the other end of semiconductor 80, the base electrode $b_2$ has ohmic contact, this electrode being at a negative potential $-V_1$ applied by battery $B_2$. On one face of the semiconductor, midway between its ends, a pair of spaced indium dots 81 and 82 are fused into the germanium to provide rectifying P junctions thereat, denoted $P_1$ and $P_2$ in Fig. 11. On the opposite face of the semiconductor, a relatively large mass 83, of lead-antimony alloy is fused into the germanium to provide a rectifying N junction thereat. The N junction is located on this face of the semiconductor midway between the base electrodes $b_1$ and $b_2$ and has its opposite ends disposed directly opposite the $P_1$ and $P_2$ junctions, respectively.

In the Fig. 11, circuit, the $P_1$ junction is connected to a parallel combination of condenser 84 and resistor 85, which have their opposite terminals grounded. In like manner, the $P_2$ junction is connected to a parallel combination of condenser 86 and resistor 87, which have their opposite terminals grounded. The N junction is connected through a coupling condenser 88 to a source of negative input voltage applied between terminals **91*a* and 91*b*. A resistor 89**, is connected between a positive voltage $+V_2$ (provided by battery $B_3$) and the N junction, so that normally the N junction is biased positive with respect to ground and positive with respect to the contiguous portion of the semiconductor.

Figure 12:
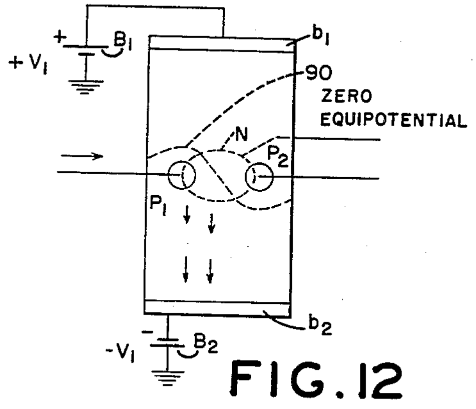
Figures 12–15 are schematic views showing the current and voltage conditions in the Figure 11 semiconductor device in successive stages of its operation.
Figure 13:
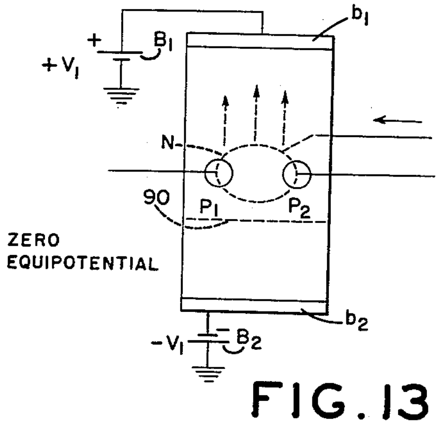

Theoretically, if the Fig. 11 device were perfectly balanced, none of the P and N junctions would draw current in the absence of an input signal. However, this theoretical condition will not hold true in practice and by suitable design one or the other of the P junctions can be caused to start drawing current in the absence of an input signal. Assuming (Fig. 12) that the $P_1$ junction starts conducting first, the hole current emitted into the semiconductor by $P_1$ will be swept toward the negative base electrode $b_2$. This lowers the resistivity of the semiconductor under the $P_1$ junction and distorts the potential gradient in the semiconductor so that the zero equipotential 90 will assume the position shown in Fig. 12. The $P_2$ junction, grounded at this time, will have a potential negative with respect to the contiguous semiconductor material and therefore will be cut off.

When a negative input signal is applied at terminals **91*a*, 91*b*, the N junction will go negative with respect to the contiguous semiconductor material and will inject electrons into the semiconductor. These electrons will flow up to the positive base electrode $b_1$, distorting the potential gradient in the semiconductor so that the zero equipotential 90** will assume the location shown in Fig.

13, between the junctions and the negative base electrode $b_2$. The semiconductor contiguous to both P junctions will have a potential negative with respect to both, and both $P_1$ and $P_2$ will be cut off.

Figures 14, 15:
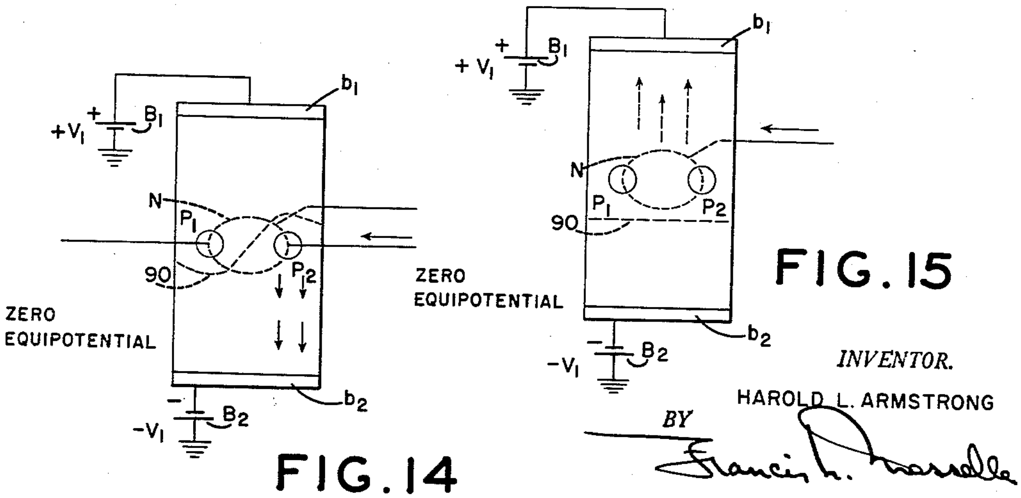

At the end of the negative input signal, the zero equipotential will tend to move away from the negative base electrode $b_2$. At this time the $P_2$ junction is still at ground potential, while the $P_1$ junction is slightly negative with respect to ground because in its previous conducting state it had rendered the upper terminal of condenser 84 negative with respect to ground, which condition cannot change instantaneously. Therefore, the other P junction, $P_2$, being at a higher potential will begin to draw current first. The N junction ceases to draw current due to its positive bias from $+V_2$. The holes injected by $P_2$ into the semiconductor will be swept toward the negative base electrode $b_2$, distorting the potential gradient in the semiconductor so that the zero equipotential 90 will assume the position shown in Fig. 14. $P_1$ remains cut off.

The next negative input signal to terminals 91*a*, 91*b* drives the N junction negative with respect to the contiguous semiconductor material, cutting off both P junctions (Fig. 15) as before.

At the completion of this negative input pulse, the $P_1$ junction will draw current and the $P_2$ junction remains cut off. Thus, bistable circuit operation is obtained in which the P junctions conduct in alternate sequence.

From the foregoing description, it will be evident that the present invention is susceptible of numerous and varied embodiments, which are adapted for various particular applications. However, while in the foregoing description and the accompanying drawings there have been disclosed several specific preferred embodiments of the present invention, it is to be understood that various modifications, omissions and refinements which depart from the specific disclosed embodiments may be adapted without departing from the spirit and scope of this invention.

I claim:

1. A semiconductor device comprising a substantially intrinsic semiconductor, base electrodes having ohmic connections to the semiconductor at spaced locations thereon for establishing an electric field therein, a plurality of electrodes having rectifying junction contacts of different conductivity types on the semiconductor between the base electrodes at locations on the semiconductor which are simultaneously at the same potential intermediate the potentials at the base electrodes in the absence of current between any of the junction contacts and the semiconductor, and means for changing the potential gradient in the semiconductor between one of said junction contacts and a base electrode to cause current to flow between said junction contact and the semiconductor and to maintain the other junction contact nonconducting.

2. A semiconductor device comprising a substantially intrinsic semiconductor, base electrodes having ohmic connections to the semiconductor at spaced locations thereon and polarized to establish a potential gradient through the semiconductor, a plurality of electrodes having rectifying junction contacts of different conductivity types on the semiconductor between the base electrodes at locations on the semiconductor which are simultaneously at the same potential intermediate the potentials at the base electrodes in the absence of current between any of the junction contacts and the semiconductor, and means for changing the resistivity of the semiconductor between one of said junction contacts and a base electrode to establish a potential difference between said junction contact and the semiconductor contiguous to said junction contact for the flow of current between said junction contact and the semiconductor.

3. A semiconductor device comprising a substantially intrinsic semiconductor, a plurality of electrodes having spaced rectifying contacts to the semiconductor intermediate its extent at least one of said contacts being of a conductivity type different from the remainder, means for establishing a potential gradient through the semiconductor with the semiconductor at its portions contiguous to the respective rectifying contacts being simultaneously at equal potentials in the absence of current between any of the rectifying contacts and the semiconductor, and means for changing the potential gradient through the semiconductor to control the current flow to the rectifying contacts.

4. A semiconductor device comprising a substantially intrinsic semiconductor, a plurality of electrodes having spaced rectifying junctions at the semiconductor intermediate its length at least one of said junctions being of a conductivity type different from the remainder, base electrodes having ohmic contacts on the semiconductor at spaced locations thereon on opposite sides of said rectifying junctions and biased to establish an electric field through the semiconductor which, in the absence of current to any of the rectifying junctions, establishes equal potentials simultaneously at the portions of the semiconductor contiguous respectively to the rectifying junctions, and means for changing the potential gradient through the semiconductor to establish different potentials therein contiguous to the rectifying junctions.

5. A semiconductor device comprising a semiconductor, a pair of base electrodes having ohmic contacts on opposite ends of the semiconductor, means for establishing a potential difference between said base electrodes to establish an electric field in said semiconductor, a pair of electrodes having P and N type rectifying junctions respectively on opposite faces of the semiconductor intermediate the ends of the semiconductor, said junctions contacting the semiconductor at portions thereof which are simultaneously at the same potential in the absence of current between either junction and the semiconductor, and means for changing the potnetial gradient in the semiconductor between one of said junctions and a base electrode to cause current to flow between said junction and the semiconductor and to cut off the other junction.

6. The device of claim 5, wherein said last-mentioned means comprises means for passing current to said one junction.

7. The device of claim 5, wherein said last-mentioned means comprises means controlling the impingement of light on the semiconductor between a junction and a base electrode.

8. A semiconductor device comprising a semiconductor, a pair of electrodes having P and N type rectifying junction contacts respectively on opposite faces of the semiconductor intermediate the ends of the semiconductor, a pair of base electrodes having ohmic contacts to opposite ends of the semiconductor and biased to establish a potential gradient through the semiconductor with the portions of the semiconductor contiguous to the P and N rectifying contacts being simultaneously at equal potentials in the absence of current to either rectifying contact, and means for changing the potential gradient through the semiconductor between the rectifying contacts and the base electrodes to control the current flow to the rectifying contacts.

9. A semiconductor device comprising a semiconductor, base electrodes having ohmic connections to opposite ends of the semiconductor for establishing an electric field therein, a pair of electrodes having P and N rectifying contacts respectively on opposite faces of the semiconductor between the base electrodes at locations on the semiconductor which are simultaneously at the same potential intermediate the potentials at the base electrodes in the absence of current between either rectifying contact and the semiconductor, and means for selectively lowering the resistivity of the semiconductor between said rectifying contacts and one of said base electrodes to cause current to flow between one of said rectifying contacts and said base electrode through the semiconductor and to render the other rectifying contact non-conducting.

10. A semiconductor device comprising a semiconductor, a pair of electrodes having rectifying contacts of different conductivity types respectively to opposite sides of the semiconductor intermediate its extent, base electrodes having ohmic connections to opposite ends of the semiconductor and polarized to establish a potential gradient through the semiconductor with the respective potentials at the portions of the semiconductor contiguous to the rectifying contacts being simultaneously equal and intermediate the base electrode potentials in the absence of current between either rectifying contact and the semiconductor, and means for altering the potential gradient through the semiconductor to render one of said rectifying contacts conducting and the other non-conducting.

11. A bistable circuit comprising a semiconductor, a pair of base electrodes having ohmic contacts respectively to opposite ends of the semiconductor, means establishing a potential difference between the base electrodes to establish an electric field in said semiconductor, a first resistance means having its terminals at the respective potentials of the base electrodes, a second resistor having one terminal connected to said first resistance means at a point thereon which is biased to a potential midway between the potentials at the base electrodes, a pair of electrodes having rectifying junctions of different conductivity types to opposite faces of the semiconductor midway between its ends at locations thereon which are simultaneously at equal potentials midway between the potentials at the base electrodes in the absence of current to either junction, said junctions being connected to the opposite terminal of said second resistor, and a condenser connected in parallel with said second resistor.

12. A bistable circuit comprising a semiconductor, base electrodes having ohmic contacts on opposite ends of the semiconductor and connected respectively to a potential source and to ground to establish a potential gradient through the semiconductor, a pair of electrodes having P and N type junctions respectively to opposite faces of the semiconductor midway between its ends at locations thereon which are simultaneously at equal potentials in the absence of current to either of said junctions, a first resistance means connected between said potential source and ground, a second resistor connected between said junctions and a midpoint on said first resistance means, and a condenser connected in parallel with said second resistor.

13. A bistable circuit comprising a semiconductor, a pair of base electrodes having ohmic contacts respectively to opposite ends of the semiconductor, one of said base electrodes being connected to a potential source and the other of said base electrodes being connected to ground to establish a potential gradient through the semiconductor, first resistance means connected between said one base electrode and ground, a second resistor connected to the midpoint of said resistance means which is biased to a potential one-half that of said potential source, a pair of electrodes having P and N type rectifying junctions respectively to opposite faces of the semiconductor midway between its ends at locations on the tential half that of said potential source due to the potential gradient established by the base electrodes through the semiconductor, said rectifying junctions being con- semiconductor which are simultaneously biased to a po- nected in parallel with each other to the opposite terminal of said second resistor to be biased to the potential half that of said potential source, and a condenser connected in parallel with said second resistor between said rectifying junctions and the midpoint on said first resistance means to establish a time delay for a change in the potential at the rectifying junctions.

14. A square wave generator comprising a semiconductor, base electrodes having ohmic contacts to opposite ends of the semiconductor and biased respectively positive and negative with respect to ground to establish a potential gradient through the semiconductor, a pair of electrodes having P and N type rectifying junctions respectively on opposite faces of the semiconductor midway between the base electrodes at locations on the semiconductor which are at zero potential in the absence of current to either rectifying junction, a resistor, said rectifying junctions being connected in parallel to one terminal of said resistor, and a condenser connected between the other terminal of said resistor and ground.

15. A wave squarer comprising a semiconductor, base electrodes having ohmic contacts to opposite ends of the semiconductor and biased respectively positive and negative to establish an electric field in the semiconductor, a pair of electrodes having rectifying junction contacts of different conductivity types respectively on opposite faces of the semiconductor midway between the base electrodes at locations on the semiconductor which are simultaneously at zero potential in the absence of current to either rectifying junction, resistance means having one terminal connected to ground, said rectifying junctions being connected in parallel to the other terminal of said resistance means, a coupling condenser having one of its terminals connected to a mid-point on said resistance means, an input circuit connected to the other terminal of said condenser, and an output circuit connected to said other terminal of said resistance means.

16. A semiconductor device comprising: a bar of intrinsic semiconductive material; a base electrode at each end of said bar making ohmic connection to said material; an electrode making P-type rectifying junction contact on one side face of said bar midway between its ends; an electrode making N-type rectifying junction contact on another side face of said bar opposite said one side face and directly opposite said P-type junction contact; means for biasing said base electrodes with equal potentials of opposite polarity to establish, in the absence of current between any of the junction contacts and said material, a linear region of zero equipotential at the location of said junction contacts; and means for changing the potential gradient in said bar of semiconductive material so as to displace said linear region of zero equipotential toward one of said base electrodes and cause current to flow between one of said junction contacts and the other of said base electrodes while rendering the other of said junction contacts non-conducting.

References Cited in the file of this patent

UNITED STATES PATENTS

| | | |
|---|---|---|
| 2,553,491 | Shockley | May 15, 1951 |
| 2,600,500 | Haynes et al. | June 17, 1952 |
| 2,666,814 | Shockley | Jan. 19, 1954 |
| 2,717,342 | Pfann | Sept. 6, 1955 |
| 2,778,885 | Shockley | Jan. 22, 1957 |
| 2,778,956 | Dacey et al. | Jan. 22, 1957 |
| 2,790,037 | Shockley | Apr. 23, 1957 |

UNITED STATES PATENT OFFICE

CERTIFICATE OF CORRECTION

Patent No. 2,927,221 March 1, 1960

Harold L. Armstrong

It is hereby certified that error appears in the printed specification of the above numbered patent requiring correction and that the said Letters Patent should read as corrected below.

Column 13, line 67, strike out "semiconductor which are simultaneously biased to a po-" and insert the same after "on the" in line 63, same column 13.

Signed and sealed this 6th day of September 1960.

(SEAL)

Attest:

ERNEST W. SWIDER
Attesting Officer

ROBERT C. WATSON
Commissioner of Patent